(12) United States Patent
Ishizuka et al.

(10) Patent No.: US 6,313,767 B1
(45) Date of Patent: Nov. 6, 2001

(54) DECODING APPARATUS AND METHOD

(75) Inventors: Keiji Ishizuka, Tokyo; Tetsuya Tateno, Hadano; Koji Aoki, Kamakura, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/503,591

(22) Filed: Feb. 14, 2000

(30) Foreign Application Priority Data

Feb. 19, 1999 (JP) .................................................. 11-041505
Jul. 27, 1999 (JP) .................................................. 11-212715

(51) Int. Cl.⁷ .................................................. H03M 7/40
(52) U.S. Cl. .................................................. 341/67
(58) Field of Search .................................. 341/67, 65, 95, 341/59, 60; 348/416; 382/234

(56) References Cited

U.S. PATENT DOCUMENTS

| 5,262,873 | 11/1993 | Ishizuka et al. ..................... 358/443 |
| 5,473,378 | * 12/1995 | Tamitani ............................. 348/416 |
| 5,655,032 | 8/1997 | Ohsawa et al. ..................... 382/238 |
| 5,751,233 | 5/1998 | Tateno et al. ....................... 341/67 |
| 5,784,497 | 7/1998 | Ishizuka et al. ..................... 382/247 |
| 5,848,194 | 12/1998 | Ishizuka et al. ..................... 382/234 |
| 6,026,197 | 2/2000 | Ohsawa et al. ..................... 382/240 |
| 6,144,322 | * 11/2000 | Sato ..................................... 341/67 |

* cited by examiner

Primary Examiner—Brian Young
Assistant Examiner—John Nguyen
(74) Attorney, Agent, or Firm—Fitzpatrick, Cella, Harper & Scinto

(57) ABSTRACT

A decoding apparatus which efficiently stores information to determine an address value to read a decoded value from a decoded value memory. The apparatus performs decoding processing at a high speed, and further, reduces the memory capacity. The apparatus comprises a first storage for continuously storing decoded values for variable-length codes of the same code length; a second storage for storing an initial address in the first storage; a third storage for storing offset values between the initial address in the first storage and addresses for storing decoded values for variable-length codes of respective code lengths, respectively; a first specification unit for specifying a code length of an input variable-length code; a second specification unit for specifying the order of the input variable-length code among variable-length codes belonging to the specified code length; and an address generator for generating an address to read a decoded value from the first storage, based on the offset value corresponding to the code length specified by the first specification unit and the order specified by the second specification unit.

36 Claims, 15 Drawing Sheets

(FOR LUMINANCE COMPONENT) FIG. 3A

| SSSS | CODE LENGTH | CODE WORD | NUMBER OF CODE WORDS |
|---|---|---|---|
| 0 | 2 | 00 | 1 |
| 1 | 3 | 010 | 5 |
| 2 | 3 | 011 | |
| 3 | 3 | 100 | |
| 4 | 3 | 101 | |
| 5 | 3 | 110 | |
| 6 | 4 | 1110 | 1 |
| 7 | 5 | 11110 | 1 |
| 8 | 6 | 111110 | 1 |
| 9 | 7 | 1111110 | 1 |
| 10 | 8 | 11111110 | 1 |
| 11 | 9 | 111111110 | 1 |

(FOR COLOR DIFFERENCE COMPONENT) FIG. 3B

| SSSS | CODE LENGTH | CODE WORD | NUMBER OF CODE WORDS |
|---|---|---|---|
| 0 | 2 | 00 | 3 |
| 1 | 2 | 01 | |
| 2 | 2 | 10 | |
| 3 | 3 | 110 | 1 |
| 4 | 4 | 1110 | 1 |
| 5 | 5 | 11110 | 1 |
| 6 | 6 | 111110 | 1 |
| 7 | 7 | 1111110 | 1 |
| 8 | 8 | 11111110 | 1 |
| 9 | 9 | 111111110 | 1 |
| 10 | 10 | 1111111110 | 1 |
| 11 | 11 | 11111111110 | 1 |

HUFFMAN TABLE

FIG. 4

| ADDRESS | OUTPUT |
|---|---|
| F000 | 0 |
| F001 | 1 |
| F002 | 2 |
| F003 | 3 |
| F004 | 4 |
| F005 | 5 |
| F006 | 6 |
| F007 | 7 |
| F008 | 8 |
| F009 | 9 |
| F00A | 10 |
| F00B | 11 |
| F00C | 0 |
| F00D | 1 |
| F00E | 2 |
| F00F | 3 |
| F010 | 4 |
| F011 | 5 |
| F012 | 6 |
| F013 | 7 |
| F014 | 8 |
| F015 | 9 |
| F016 | 10 |
| F017 | 11 |

FOR LUMINANCE COMPONENT (F000–F00B)

FOR COLOR DIFFERENCE COMPONENT (F00C–F017)

DECODING TABLE RAM

FIG. 9

| NNNN/SSSS | CODE LENGTH | HUFFMAN CODE | NNNN/SSSS | CODE LENGTH | HUFFMAN CODE |
|---|---|---|---|---|---|
| 01 | 2 | 00 | 18 | 16 | 1111111110000110 |
| 02 | 2 | 01 | 19 | 16 | 1111111110000111 |
| 03 | 3 | 100 | 1A | 16 | 1111111110001000 |
| 00 | 4 | 1010 | 25 | 16 | 1111111110001001 |
| 04 | 4 | 1011 | 26 | 16 | 1111111110001010 |
| 11 | 4 | 1100 | 27 | 16 | 1111111110001011 |
| 05 | 5 | 11010 | 28 | 16 | 1111111110001100 |
| 12 | 5 | 11011 | 29 | 16 | 1111111110001101 |
| 21 | 5 | 11100 | 2A | 16 | 1111111110001110 |
| 31 | 6 | 111010 | 34 | 16 | 1111111110001111 |
| 41 | 6 | 111011 | 35 | 16 | 1111111110010000 |
| 06 | 7 | 1111000 | 36 | 16 | 1111111110010001 |
| 13 | 7 | 1111001 | 37 | 16 | 1111111110010010 |
| 51 | 7 | 1111010 | 38 | 16 | 1111111110010011 |
| 61 | 7 | 1111011 | 39 | 16 | 1111111110010100 |
| 07 | 8 | 11111000 | 3A | 16 | 1111111110010101 |
| 22 | 8 | 11111001 | 43 | 16 | 1111111110010110 |
| 71 | 8 | 11111010 | 44 | 16 | 1111111110010111 |
| 14 | 9 | 111110110 | 45 | 16 | 1111111110011000 |
| 32 | 9 | 111110111 | 46 | 16 | 1111111110011001 |
| 81 | 9 | 111111000 | 47 | 16 | 1111111110011010 |
| 91 | 9 | 111111001 | 48 | 16 | 1111111110011011 |
| A1 | 9 | 111111010 | 49 | 16 | 1111111110011100 |
| 08 | 10 | 1111110110 | 4A | 16 | 1111111110011101 |
| 23 | 10 | 1111110111 | 53 | 16 | 1111111110011110 |
| 42 | 10 | 1111111000 | 54 | 16 | 1111111110011111 |
| B1 | 10 | 1111111001 | 55 | 16 | 1111111110100000 |
| C1 | 10 | 1111111010 | 56 | 16 | 1111111110100001 |
| 15 | 11 | 11111110110 | 57 | 16 | 1111111110100010 |
| 52 | 11 | 11111110111 | 58 | 16 | 1111111110100011 |
| D1 | 11 | 11111111000 | 59 | 16 | 1111111110100100 |
| F0 | 11 | 11111111001 | 5A | 16 | 1111111110100101 |
| 24 | 12 | 111111110100 | 63 | 16 | 1111111110100110 |
| 33 | 12 | 111111110101 | 64 | 16 | 1111111110100111 |
| 62 | 12 | 111111110110 | 65 | 16 | 1111111110101000 |
| 72 | 12 | 111111110111 | 66 | 16 | 1111111110101001 |
| 82 | 15 | 111111111000000 | 67 | 16 | 1111111110101010 |
| 09 | 16 | 1111111110000010 | 68 | 16 | 1111111110101011 |
| 0A | 16 | 1111111110000011 | 69 | 16 | 1111111110101100 |
| 16 | 16 | 1111111110000100 | 6A | 16 | 1111111110101101 |
| 17 | 16 | 1111111110000101 | 73 | 16 | 1111111110101110 |

FIG. 10

| NNNN/SSSS | CODE LENGTH | HUFFMAN CODE | NNNN/SSSS | CODE LENGTH | HUFFMAN CODE |
|---|---|---|---|---|---|
| 74 | 16 | 1111111110101111 | B9 | 16 | 1111111111010111 |
| 75 | 16 | 1111111110110000 | BA | 16 | 1111111111011000 |
| 76 | 16 | 1111111110110001 | C2 | 16 | 1111111111011001 |
| 77 | 16 | 1111111110110010 | C3 | 16 | 1111111111011010 |
| 78 | 16 | 1111111110110011 | C4 | 16 | 1111111111011011 |
| 79 | 16 | 1111111110110100 | C5 | 16 | 1111111111011100 |
| 7A | 16 | 1111111110110101 | C6 | 16 | 1111111111011101 |
| 83 | 16 | 1111111110110110 | C7 | 16 | 1111111111011110 |
| 84 | 16 | 1111111110110111 | C8 | 16 | 1111111111011111 |
| 85 | 16 | 1111111110111000 | C9 | 16 | 1111111111000000 |
| 86 | 16 | 1111111110111001 | CA | 16 | 1111111111000001 |
| 87 | 16 | 1111111110111010 | D2 | 16 | 1111111111000010 |
| 88 | 16 | 1111111110111011 | D3 | 16 | 1111111111000011 |
| 89 | 16 | 1111111110111100 | D4 | 16 | 1111111111000100 |
| 8A | 16 | 1111111110111101 | D5 | 16 | 1111111111000101 |
| 92 | 16 | 1111111110111110 | D6 | 16 | 1111111111000110 |
| 93 | 16 | 1111111110111111 | D7 | 16 | 1111111111000111 |
| 94 | 16 | 1111111111000000 | D8 | 16 | 1111111111001000 |
| 95 | 16 | 1111111111000001 | D9 | 16 | 1111111111001001 |
| 96 | 16 | 1111111111000010 | DA | 16 | 1111111111001010 |
| 97 | 16 | 1111111111000011 | E1 | 16 | 1111111111001011 |
| 98 | 16 | 1111111111000100 | E2 | 16 | 1111111111001100 |
| 99 | 16 | 1111111111000101 | E3 | 16 | 1111111111001101 |
| 9A | 16 | 1111111111000110 | E4 | 16 | 1111111111001110 |
| A2 | 16 | 1111111111000111 | E5 | 16 | 1111111111001111 |
| A3 | 16 | 1111111111001000 | E6 | 16 | 1111111111110000 |
| A4 | 16 | 1111111111001001 | E7 | 16 | 1111111111110001 |
| A5 | 16 | 1111111111001010 | E8 | 16 | 1111111111110010 |
| A6 | 16 | 1111111111001011 | E9 | 16 | 1111111111110011 |
| A7 | 16 | 1111111111001100 | EA | 16 | 1111111111110100 |
| A8 | 16 | 1111111111001101 | F1 | 16 | 1111111111110101 |
| A9 | 16 | 1111111111001110 | F2 | 16 | 1111111111110110 |
| AA | 16 | 1111111111001111 | F3 | 16 | 1111111111110111 |
| B2 | 16 | 1111111111010000 | F4 | 16 | 1111111111111000 |
| B3 | 16 | 1111111111010001 | F5 | 16 | 1111111111111001 |
| B4 | 16 | 1111111111010010 | F6 | 16 | 1111111111111010 |
| B5 | 16 | 1111111111010011 | F7 | 16 | 1111111111111011 |
| B6 | 16 | 1111111111010100 | F8 | 16 | 1111111111111100 |
| B7 | 16 | 1111111111010101 | F9 | 16 | 1111111111111101 |
| B8 | 16 | 1111111111010110 | FA | 16 | 1111111111111110 |

US 6,313,767 B1

DECODING APPARATUS AND METHOD

FIELD OF THE INVENTION

The present invention relates to a decoding apparatus which decodes a variable-length code such as a Huffman code.

BACKGROUND OF THE INVENTION

In recent years, a still-picture digital signal compression technique, JPEG (Joint Photographic Experts Group) and a moving-image digital signal compression technique, MPEG (Moving Picture Experts Group) are known as global standard techniques.

In these compression techniques, an image signal is orthogonally transformed by using DCT (Discrete Cosine Transformation), and subjected to the Huffman coding. Among the frequency components after the orthogonal transformation, the information of high frequency components are reduced, and further, in the Huffman coding, among the information representing these frequency components, a longer Huffman code is allocated to information with lower probability of occurrence, while a shorter Huffman code is allocated to information with higher probability of occurrence. In this manner, the amount of data of the original image signal can be reduced.

Further, a known method in a Huffman-code decoding apparatus is to store decoded values from respective Huffman codes in a decoded value memory in advance, then when a Huffman code to be decoded is inputted, interpret the code length corresponding to the Huffman code and the priority order of the Huffman code in a Huffman code group having the code length, then read an actual address value in the decoded value memory containing the Huffman-code decoded values from an address memory corresponding to the code length, and read a decoded value for the Huffman code from a predetermined position of the decoded value memory in accordance with the address value and the priority order.

However, in the conventional Huffman-code decoding method, as the actual address values in the above-described decoded value memory are stored in the address memories corresponding to the respective code lengths, the entire capacity of the address memory is large.

SUMMARY OF THE INVENTION

The present invention has been made in consideration of the above situation, and has its object to efficiently store information to determine an address value to read a decoded value for a variable-length code from a decoded value memory.

Further, another object of the present invention is to store an address value in a memory, not as an actual address value of a decoded value memory, but as data in a form to be efficiently generated as the address value.

According to the present invention, the foregoing object is attained by providing a decoding apparatus comprising: first storage means for continuously storing decoded values for variable-length codes of the same code length; second storage means for storing an initial address in the first storage means; third storage means for storing offset values between the initial address in the first storage means and addresses for storing decoded values for variable-length codes of respective code lengths, respectively; first specification means for specifying a code length of an input variable-length code; second specification means for specifying the order of the input variable-length code among variable-length codes belonging to the specified code length; and address generation means for generating an address to read a decoded value from the first storage means, based on the offset value corresponding to the code length specified by the first specification means and the order specified by the second specification means.

Otherwise, the foregoing object is attained by providing a decoding apparatus comprising: first storage means for continuously storing decoded values for variable-length codes of the same code length; second storage means for storing plural data each on the number of variable-length codes belonging to each code length; first specification means for specifying a code length of an input variable-length code; second specification means for specifying the order of the input variable-length code among variable-length codes belonging to the specified code length; generation means for generating an accumulated value obtained by accumulating the plural data on the numbers of codes stored in the second storage means based on the code length specified by the first specification means; and address generation means for generating an address to read a decoded value from the first storage means based on the accumulated value and the order specified by the second specification means.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 3A and 3B illustrate Huffman code tables;

FIG. 4 illustrates a decoding table RAM showing an example of data stored in a memory circuit in the first embodiment;

FIGS. 9 and 10 illustrate Huffman tables in the conventional art;

DETAILED DESCRIPTION OF THE PREFERRED EMBODIMENTS

Preferred embodiments of the present invention will now be described in detail in accordance with the accompanying drawings.

First Embodiment

First, a first embodiment as the base of the present invention will be described.

FIG. 3A shows a Huffman code table for group numbers in DC luminance components. In the table, numerals in an "SSSS" column are group numbers (or data divided into groups in accordance with luminance component levels, which may be regarded as luminance component themselves) used in the above-described JPEG Huffman coding. In the present embodiment, when SSSS=0 holds as a group number, a 2 code-length Huffman code "00" is allocated to the group. Similarly, a 3 code-length Huffman code "010" is allocated to a group number SSSS=1. FIG. 3B shows an example of the Huffman code table for group numbers in DC color-difference components.

Next, the decoding operation on a Huffman code (Huffman code 200) based on the Huffman code table will be described in orderly sequence.

Figure 2:
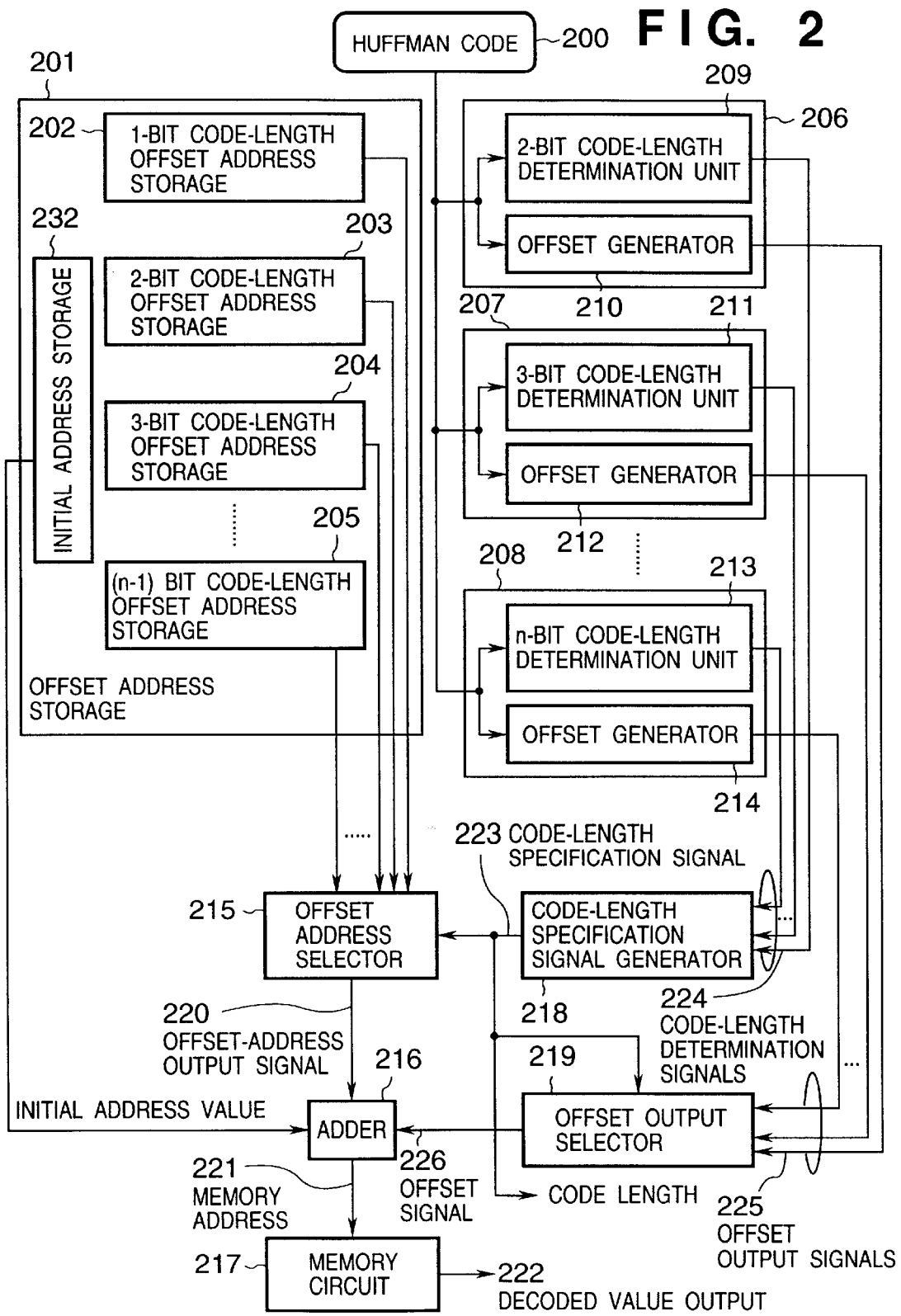
FIG. 2 is a block diagram showing the decoding apparatus according to a first embodiment of the present invention.

In FIG. 2, reference numeral 206 denotes a 2-bit code processor; 207, a 3-bit code processor; 208, an n-bit code processor; 209, 211 and 213 denote determination units which respectively determine whether a Huffman code to be decoded has a specific number of bits or more. Numeral 222 denotes a decoded value output; and 224, code-length determination signals outputted from the respective processors 206 to 208. Numeral 223 denotes a code-length specification signal generator which specifies the code-length of the input Huffman code on the basis of signals 223.

In the Huffman code tables in the DC luminance and DC color-difference components in FIGS. 3A and 3B, if the input Huffman code is a 3-bit code "011" (group number SSSS=2), the output of the 3-bit code-length determination unit 211 for 3-bit or longer code length and that of the 2-bit code-length determination unit 209 for 2-bit or longer code length become active. If the input Huffman code is "11110", the determination units for 5-bit or longer code length, 4-bit or longer code length, 3-bit or longer code length and 2-bit or longer code length, become active.

Next, the operations of offset generators 210 and 212 to 214 will be described by using the operation of the offset generator 212 as a representative offset generator. In the Huffman code tables in the DC Luminance and DC color-difference components in FIGS. 3A and 3B, if the input Huffman code is a 3-bit code "100" (group number SSSS= 3), the code corresponds to the second of the 3-bit code length groups (SSSS=1 is the 0-th group) As a Huffman code is incremented by 1 in each group, the offset generator 212 obtains the order of the Huffman code 100 among the groups as the difference between the input Huffman code and the 0-th 3-bit code length, $$100(SSSS=3)-010(SSSS=1(0\text{-th}))=010(2\text{nd}).$$

Hereinbelow, the difference value will be referred to as an "offset".

The other offset generators 210 and 214 similarly generate offsets by setting the 0-th value corresponding to the respective code lengths.

Numeral 201 denotes an offset address storage, and 202 to 205, internal offset address storages (e.g., registers) for respective code lengths in the offset address storage 201. FIG. 4 shows a table RAM containing Huffman-code decoded outputs (corresponding to the groups SSSS in the DC luminance components and DC color-difference components).

In this table, the outputs "0" to "11" obtained by decoding the DC luminance components and DC color-difference components are stored in the table RAM (corresponding to a memory circuit 217 in the present embodiment). That is, outputs obtained by decoding the DC luminance components are stored in addresses "F000" to "F00B", and outputs obtained by decoding the DC color-difference components are stored in addresses "F00C" to "F017". These addresses can be represented with at least 16 bits.

As shown in FIG. 4, an address "F006" is allocated to a DC luminance component output "6". Then a 3-bit offset address value "6" is stored in advance in a 4-bit code-length offset address storage (not shown) adjacent to the 3-bit code-length offset address storage 204, in consideration of addition of 16-bit initial address value "F000" stored in an initial address storage 232 to the value by an adder 216.

In another storage method, 16-bit information representing "F006" may be stored in the 4-bit code-length offset storage itself, however, if the actual address information is stored in the respective bit-length offset address storages 202 to 205, the total number of bits of stored information is large. Accordingly, in the present embodiment, the address F000 where a luminance-component decoded value is stored is separately stored as an initial value, and immediately before the decoded value is read from the memory, the initial value is added to the address value. This suppresses the total amount of data necessary for address value determination.

In the present embodiment, based on the above method, an offset address value "1" is stored in the 3-bit code-length offset address storage 204; an offset value "0", in the 2-bit code-length offset address storage 203; and an offset value "0", in the 1-bit code-length offset address storage 202. Accordingly, the storages 202 to 205 hold merely several-bit (less than 16 bits) information.

If a Huffman code "1110" representing SSSS=6 is inputted, the determination units for 4-bit or longer code length, 3-bit or longer code length, and 2-bit or longer code length become active, and an offset signal 225 "0" is generated by the 4-bit offset generator. Then, a code-length specification signal generator 218 outputs a code-length specification signal 223 specifying the number of bits of the input code, based on the outputs from the respective determination units.

Based on the code length specified by the signal 223, an offset address selector 215 selects an offset address value "6", and outputs an offset-address output signal 220. On the other hand, an offset output selector 219 selects and outputs an offset signal 226 "0" corresponding to the offset signal 225 outputted from the 4-bit offset generator, based on the code-length specification signal 223.

The adder 216 generates a final memory address "F006" by adding the above offset address value "6" and the offset signal "0" to the initial address value "F000" read from the initial address storage. The adder 216 outputs the memory address as a read address for a memory circuit 217. Then a decoded value "6" corresponding to the address value "F006" is outputted from the memory circuit 217.

The above processing performs decoding on the DC luminance component Huffman code.

Note that regarding the DC color-difference components, a construction for storing an offset address value "12(0×C)" in a 4-bit code-length offset address storage, similar to the above construction, can perform similar decoding processing.

As described above, according to the present embodiment, as the offset address storages 202 to 205 for the respective code lengths hold only several-bit offset address values for an initial address value ("F000" in the present embodiment), instead of actual address values to read decoded values from the memory circuit 211, address values to read Huffman-code decoded values from the decoded value memory can be efficiently generated. That is, the information to determine the above address values can be efficiently stored with a small data capacity.

Second Embodiment

In the first embodiment, as shown in FIG. 4, as large-value address positions corresponding to long Huffman codes in the decoded value memory circuit 217 are stored, the number of bits of the (n−1)-bit code-length offset address storage 205 must be equal to or greater than that of the memory capacity necessary for an (n−2)-bit code-length offset address storage immediately preceding the storage 205.

In the second embodiment, this drawback is removed. Next, the second embodiment will be described with reference to FIG. 1.

Figure 1:
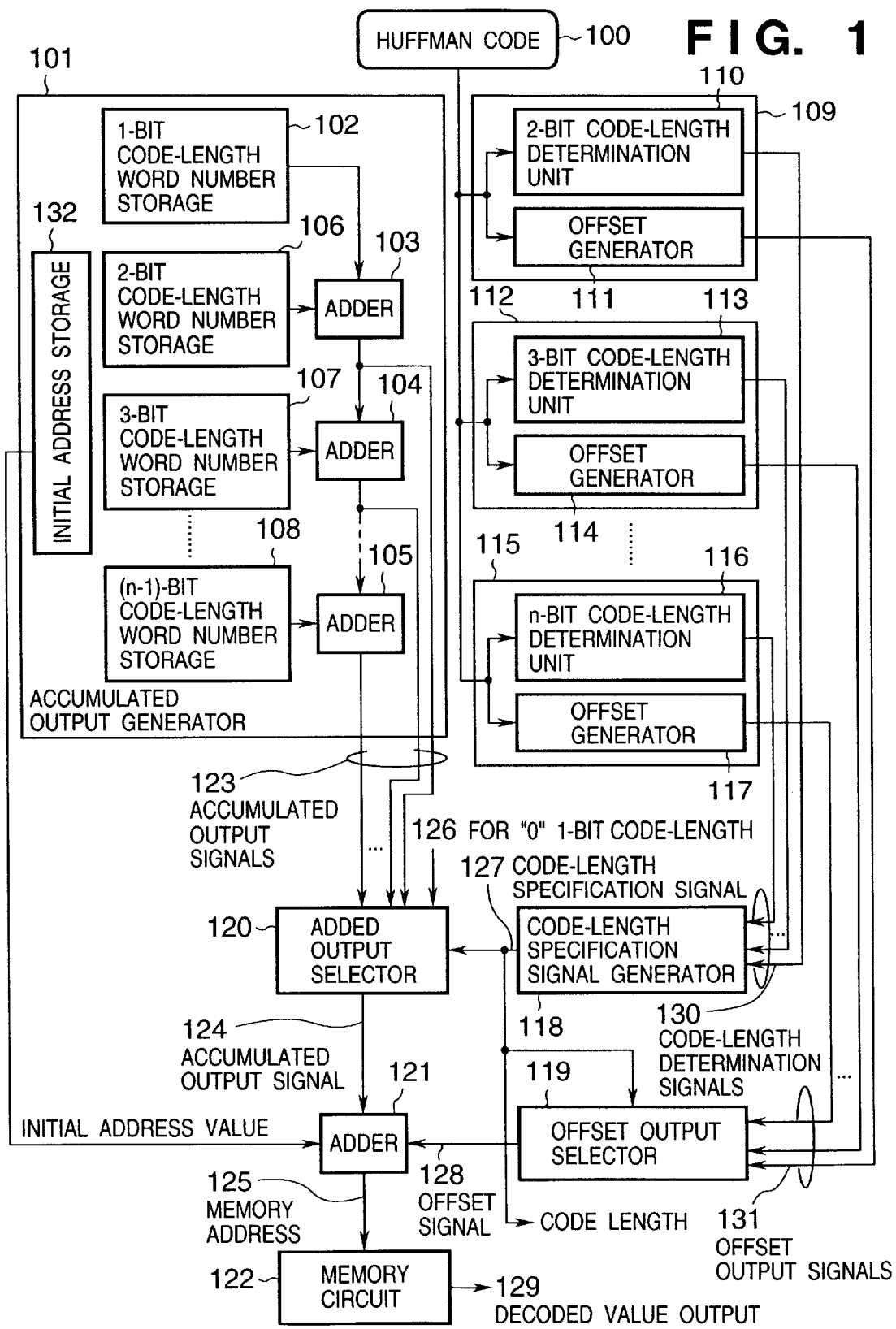
FIG. 1 is a block diagram showing a decoding apparatus according to a second embodiment of the present invention.

In FIG. 1, numeral 100 denotes an input Huffman code; 109, 112 and 115, 2−n bit code processors; 110, 113 and 116, determination units for the respective code lengths; 111, 114 and 117, offset generators for the respective code lengths; 118, a code-length specification signal generator; and 119, an offset output selector. Note that as the functions of the respective blocks are the same as those in the first embodiment in FIG. 2, the detailed explanations of the functions will be omitted, and characteristic parts of the second embodiment will be described in detail.

Numeral 101 denotes an accumulated output generator; and 102 and 106 to 108, code-length word number storages respectively for storing the number of words of codes belonging to each of the respective code lengths.

Further, numeral 129 denotes a decoded value output; and 130, a code-length determination signal outputted from the respective 2−n bit code processors 109, 112 and 115.

Next, a particular example will be described. In case of the DC luminance-component Huffman code table in FIG. 3A, 1-bit information representing the number of words "0" is stored in the 1-bit code-length word number storage 102. As the number of 2-bit code-length Huffman code is one, 1-bit information representing the number of words "1" is stored into the 2-bit code-length word number storage 106. As the number of 3-bit code-length Huffman code is five, 3-bit information representing the number of words "5" is stored into the 3-bit code-length word number storage 107. In this manner, the several-bit information representing the numbers of Huffman codes belonging to the respective code lengths are stored.

Next, an adder 103 adds the number of words "0" stored in the 2-bit code-length word number storage 102 to the number of word "1" stored in the 2-bit code-length word number storage 106, and outputs an output value "1". Further, an adder 104 adds the number of word "5" stored in the 3-bit code-length word number storage 107 to the output "1" from the adder 103, and outputs an output value "6". In this manner, the accumulated values are respectively outputted from the adders. In this arrangement, the memory capacities necessary for the respective bit code-length word number storages 102 to 108 can be smaller than those of the respective bit-lengths offset address storages 202 to 205 having the same functions in the first embodiment. The present embodiment is especially advantageous in calculation on data from a storage having a large number of bits.

Next, an added output selector 120 selects one of the plurality of accumulated outputs from the respective adder, based on a code length (code-length specification signal 127) determined and outputted by a code-length specification signal generator 118, and outputs the selected output to the following adder 121.

Next, the adder 121 adds the offset value outputted from the offset output selector 119 and an accumulated output signal 124 to the 16-bit initial address value "F000" stored in an initial address storage 132, and outputs the result of addition as a final address value to a memory circuit 122.

Next, a particular example will be described. In a case where a 3-bit code "011" is inputted as the Huffman code 100, the code-length specification signal generator 118 determines that the Huffman code is a 3-bit code. On the other hand, the added output selector 120 selects an accumulated output signal 123 (the output "1" from the adder 103) corresponding to the determined code length "3", obtained by accumulating the information represented by using only the number of bits sufficient to represent the number of Huffman codes belonging to the respective code lengths in the respective bit code-length word number storages, and outputs the selected signal, as the accumulated output signal 124, to the next process.

Next, the adder 121 adds the output value "1" from the added output selector 120 and the offset "1" outputted from the offset output selector 119 to the initial address value "F000" read from the initial address storage 132, and outputs the result of addition "F002", as a final address value, to the memory circuit 122.

By the above decoding processing, a decoded value "2", corresponding to the input "011" Huffman code 100, is outputted from the memory circuit 122.

Note that generally, many code systems do not include "1" code-length Huffman code, but in such case, the word-number storage 102 and the adder 103 can be omitted.

Further, in the present embodiment, as in the order of the adders 103 to 105, accumulation is performed on the number of code words from the shortest code length. However, the present invention is not limited to such order, but the accumulation may be performed from the longest code length. That is, the order of adders to perform accumulation may be arbitrarily set in accordance with necessity.

<Modification>

Note that in a case where it is known that the maximum value of the numbers of code words corresponding to the respective code lengths is less than a logical maximum value which can be defined in the Huffman code table, the capacities of the word number storages (102, 106, 107 and 108) corresponding to the respective code lengths can be reduced.

For example, the number of code words corresponding to 3-bit code length logically represents eight values, "000", "001", "010", "011", "100", "101", "110" and "111". In a system to decode certain Huffman code, in a case where it is known that the code represents predetermined four values among these values, if the number of words are stored in advance in the 3-bit code-length word number storage 107 by using the necessary minimum number of bits to represent the four variable-length codes which may be decoded, the 1-bit memory capacity can be less than that of general system.

Further, the memory capacity can be further reduced by providing the respective code-lengths word number storages with the numbers of bits less than the necessary numbers of bits to represent the total number of words to represent all the types of Huffman codes in the respective code lengths. For example, the total number of entries of Huffman codes in the AC luminance Huffman table in the JPEG Recommendation is 162, and the maximum number of code types belonging to the respective code lengths is 256 or less, which can be represented with 8 bits or less. Accordingly, even if the number of bits of the word number storage for 8-bit or longer code length is 8 bits or less, the Huffman code can be completely decoded. This especially reduces the memory capacity.

Further, the initial address value added by the adder 121 in FIG. 1 is not limited to a fixed value, but may be variable in accordance with various factors. For example, optimum Huffman decoding can be selectively performed by arbitrarily setting the initial address value necessary to decode a Huffman code in a necessary position, in accordance with the type of image represented by the Huffman code or the device that transmitted output the Huffman code. Further, in the above construction, in a case where the decoded value addresses must be changed due to increment in data amount in the memory circuit or the decoded values must be divided and stored into a plurality of memories, the decoded values can be reliably read. Note that the present invention is applicable to addition of negative value or subtraction of positive value by a subtracter as well as the addition of initial address.

Further, in the above embodiments, some value is added by the adder 121 as the initial address value, however, if the initial address value is "0", the addition of the initial address value is not necessary.

Further, in the above embodiments, the Huffman code is handled as a representative code, however, the present invention is not limited to the Huffman code, but is applicable to any code as long as it is a variable-length code corresponding to the descriptions in the above embodiments.

As described above, according to the first and second embodiments, it is possible to efficiently store information to determine an address value to read a decoded value for a variable-length code from a decoded value memory. Further, the address value is not stored as an actual address value of the decoded value memory, but the value can be stored in a memory in a form to be efficiently generated as the address value.

Third Embodiment

Next, a third embodiment of the present invention will be described.

First, the prior art will be briefly described and then the present embodiment will be described.

Figure 11:
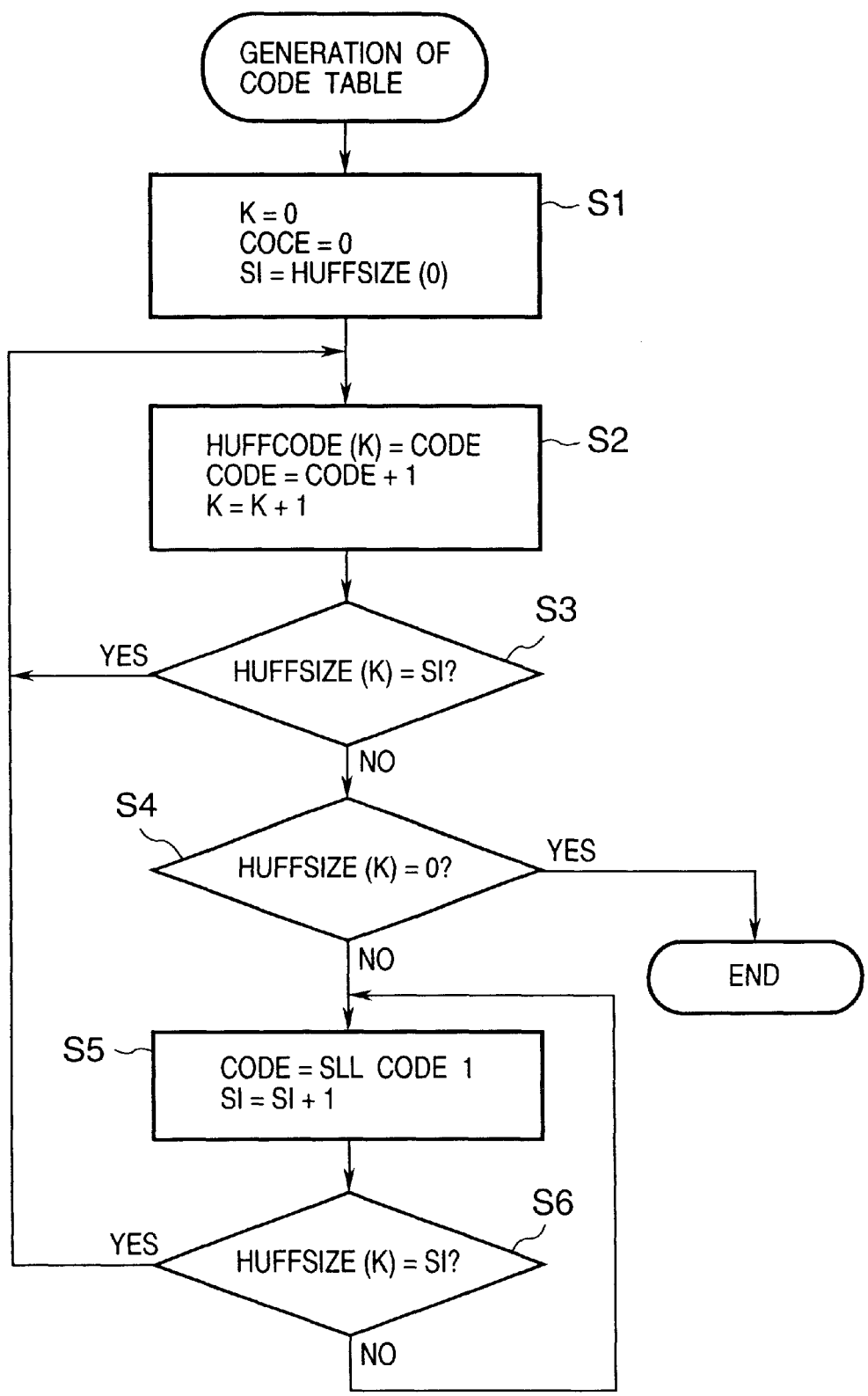
FIG. 11 is a flowchart showing Huffman-table generation processing in the conventional art.

FIGS. 9 and 10 show the K5 Huffman table in the JPEG Recommendation having re-arranged codes in the order of code length. FIG. 11 is a flowchart for generation of the JPEG Huffman table in the JPEG Recommendation. As the Huffman code generation process is described in the Recommendation, the process is not described in detail here, but the Huffman code generated in accordance with the flowchart and constraints described in the Recommendation has the following characteristics:

1. A code of arbitrary code length has a value less than that cut out from a longer code-length code, from the highest bit, for the arbitrary code length.

2. Codes of the same code length have continuous values.

In FIGS. 9 and 10, the initial code of 4-bit length codes is "1010", the next code is "1011", and the next code is "1100". Further, the last 4-bit length code is "1100", and the initial code of 5-bit length codes is "11010". If four bits are cut out from this code, obtained value is "1101", which is greater than the last 4-bit length code. All the code has this characteristic.

Figure 12:
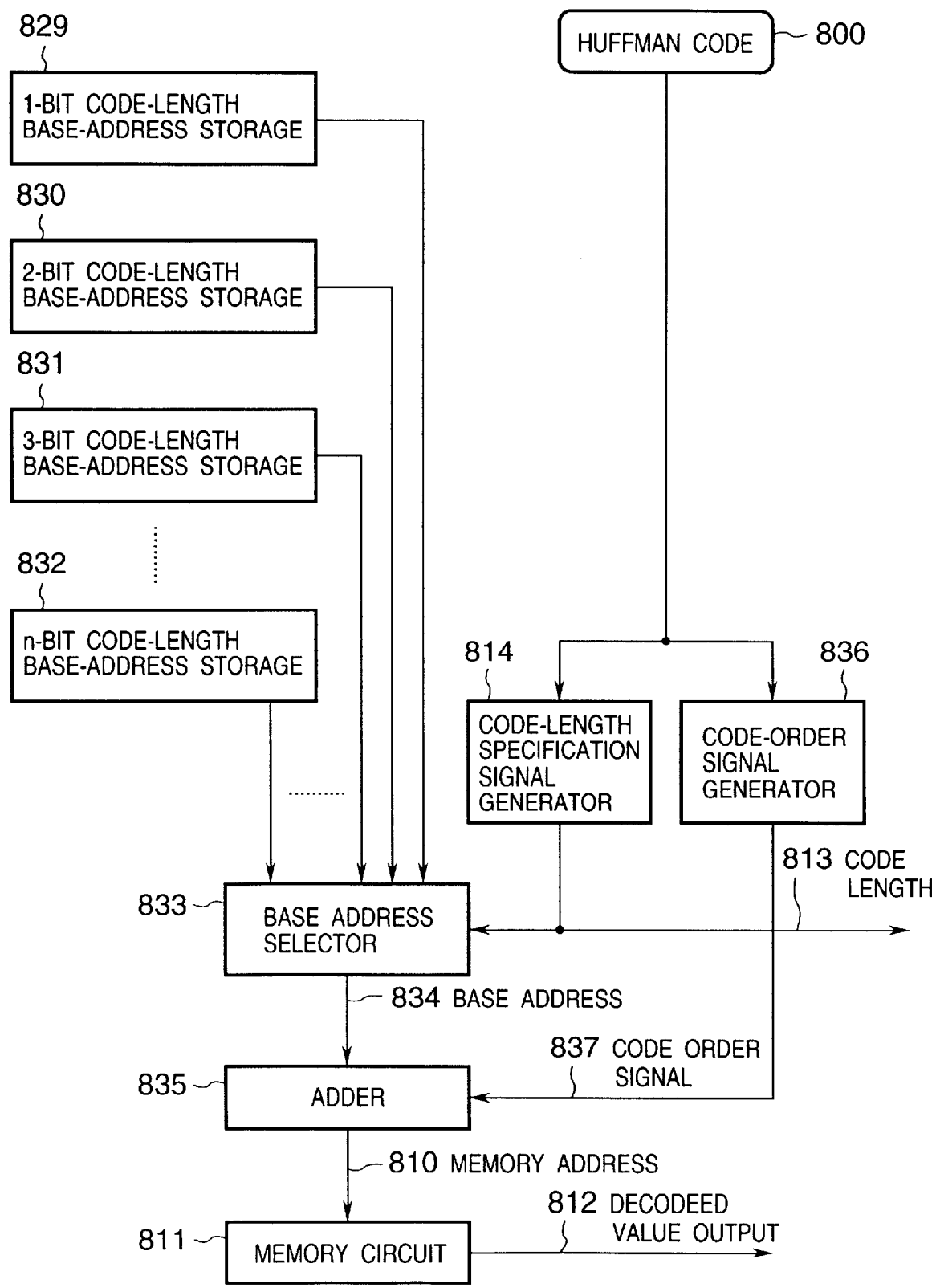
FIG. 12 is a block diagram showing the conventional decoding apparatus.

FIG. 12 is a block diagram showing the conventional decoding apparatus. Numeral 800 denotes a Huffman code to be decoded; 829 to 832, base address storages corresponding to code of respective code lengths; 811, a memory circuit in which decoded values are continuously stored for variable-length code of the same code length; 814, a code-length specification signal generator which specifies the code length of the input Huffman code; 836, a code-order signal generator which outputs the order of the Huffman code input among codes having the same code length; 813, a code length output specified by the code-length specification signal generator 814; 837, a code order signal generated by the code-order signal generator 836; 833, a base address selector which selects one of base addresses for the respective code lengths based on the code length output; 834, a base address signal selected by the base address selector 833; 835, an adder which adds the code order signal to the base address signal and outputs a memory address; and 812, a decoded value output from the memory circuit 811.

Next, the apparatus will be described with reference to FIGS. 12 and 14. The code-length specification signal generator 814 specifies a code-length by utilizing the above characteristic 1, and outputs the code length 813. The code-order signal generator 836 generates the order among the same code-length codes by utilizing the above characteristic 2. In FIG. 12, base address storages 829 to 832 hold addresses as bases of addresses where decoded values for the respective code lengths in the memory circuit 811. FIG. 15 shows an example of the address structure of the memory circuit 811. In the memory circuit 811 in FIG. 12, the Huffman-code decoded values are continuously written for the same code length, as shown in FIG. 15.

Figure 14:
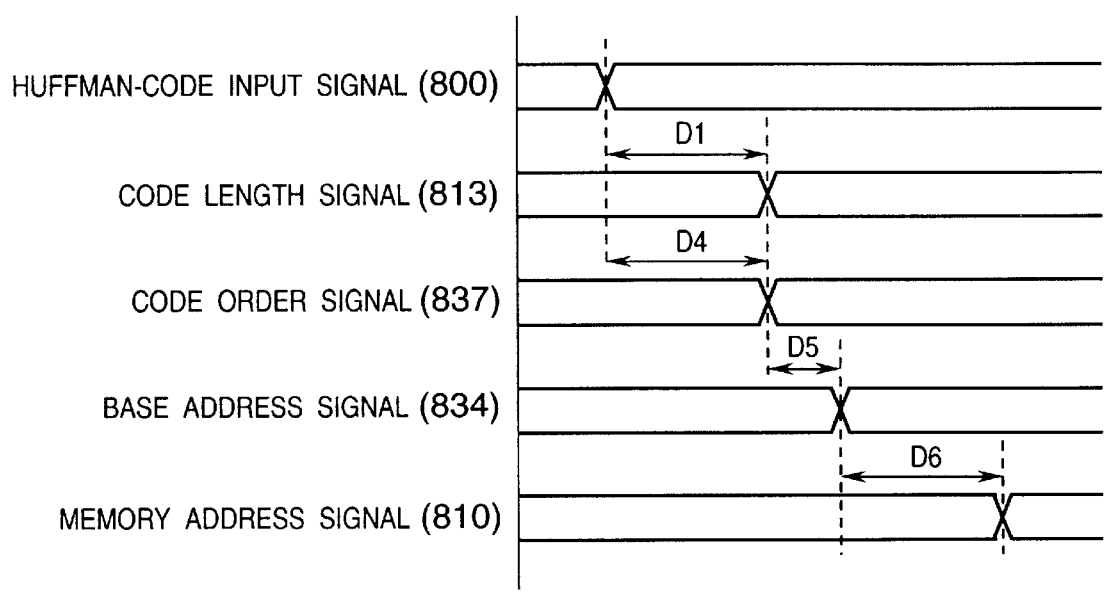
FIG. 14 is a timing chart showing the generation of decoded data reading address in the conventional art.
Figure 15:
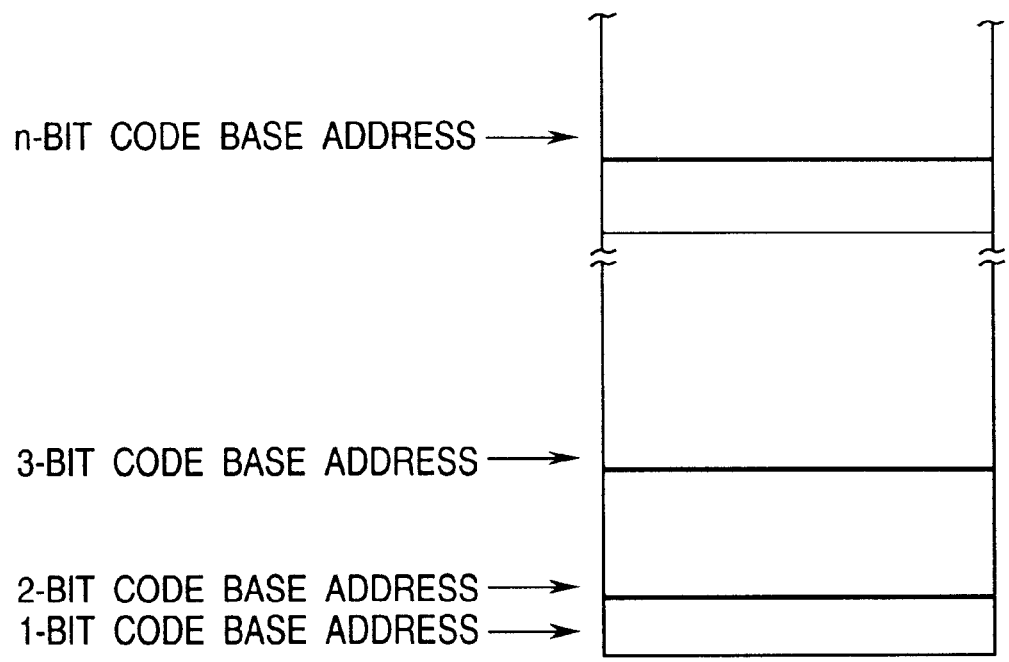
FIG. 15 is an explanatory view of the relation between the decoded data in the memory circuit and addresses in the third embodiment.

When the Huffman input signal as shown in FIG. 14 changes, the code-length specification signal generator 814 generates the code length signal 813 with a delay D1. On the other hand, the code-order signal generator 836 generates the code order signal 837 with a delay D4. The code length signal 813 is inputted into the base address selector 833. The base address selector 833 generates the base address signal 834 with a delay D5. The base address signal 834 is inputted into the adder 835. The adder 835 adds the base address signal 834 to the code order signal 837, thus generates a memory address signal 810 with a delay D6. Further, delays D1, D4 and D6 are sufficiently longer than the period of actual selection by the base address selector 833.

In this manner, the delay D1+D5+D6 occurs from the input of the Huffman signal 800 to the generation of decoding memory address 810, and the delay reduces the speed of decoding processing. This embodiment removes this drawback.

Figure 5:
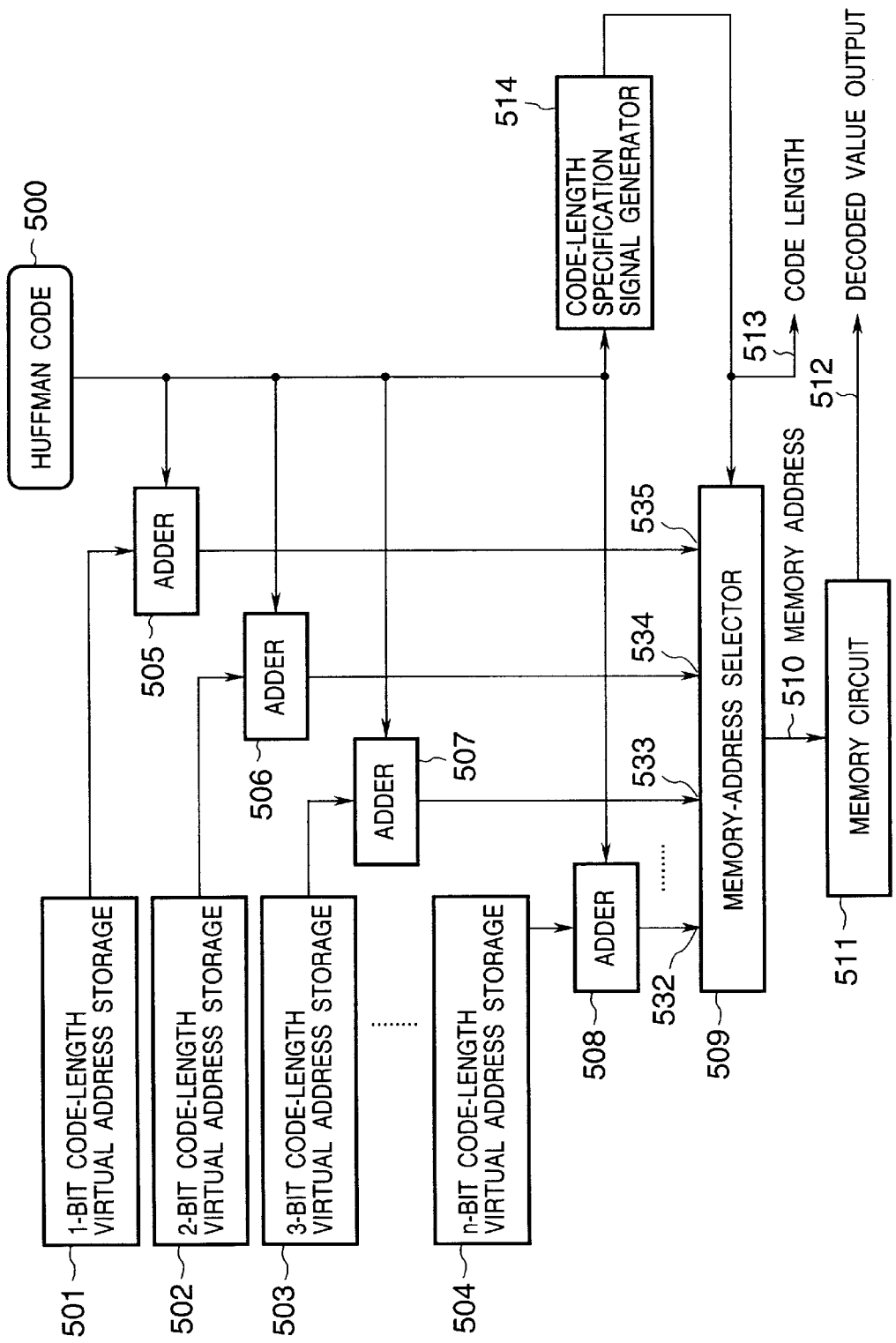
FIG. 5 is a block diagram showing the decoding apparatus according to a third embodiment of the present invention.

FIG. 5 is a block diagram showing principal elements of the decoding apparatus according to the third embodiment.

In FIG. 5, numeral 500 denotes the Huffman code input to be decoded; 501 to 504, virtual address storages corresponding to the respective code-length codes; 511, a memory circuit in which decoded values for variable-length codes of the same code-length are continuously stored; 505 to 508, adders which calculate actual addresses for the memory circuit 511 where the decoded values are continuously stored, by adding the virtual addresses to the Huffman code input; 514, a code-length specification signal generator which specifies the code length of the Huffman code input and outputs a code-length specification signal; 532 to 535, memory addresses for the respective code lengths for the memory circuit 511, calculated by the adders 505 to 508; 513, the code length output specified by the code-length specification signal generator 514; 509, a memory address selector which selects one of the memory addresses for the respective code lengths based on the code length output; and 512, a decoded value output from the memory circuit 511.

Figure 13:
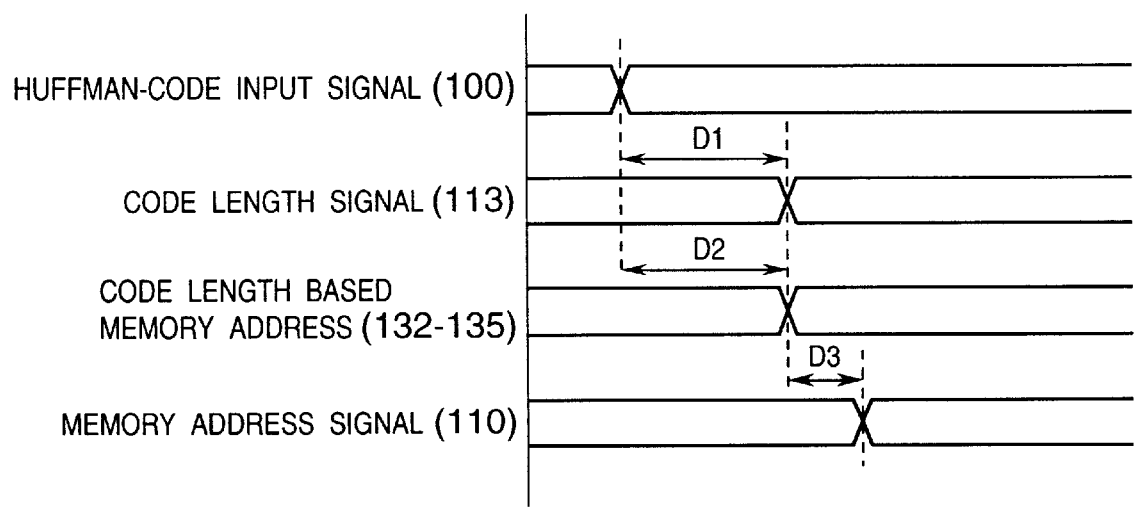
FIG. 13 is a timing chart showing the generation of decoded-data reading address in the third embodiment.

The operation of the third embodiment having the above construction will be described with reference to FIGS. 5, 13 and 15.

The code-length specification signal generator 514 outputs the code length 513 by utilizing the above-described characteristic 1.

The virtual address storages 501 to 504 hold virtual addresses for the respective code lengths. As the virtual addresses for the respective code lengths, values obtained by subtracting codes, corresponding to the base addresses for the respective code lengths in the memory circuit 511, from the base addresses for the respective code lengths as shown in FIG. 15, are stored.

In calculation of virtual address value for a 4-bit length code, in FIG. 9, the code as a base address for the 4-bit length code is "1010B (B represents a binary number)" having a value "10 (decimal number)". Assuming that the memory base address is "3", the virtual address for the 4-bit length code is 3−10=−7. Further, in the memory circuit 511, the result of decoding on the Huffman code "1010" (decoded data) is stored in the address "3", the result of decoding on Huffman code "1011" is stored in the address "4", and the result of decoding on Huffman code "1100" is stored in the address "5", continuously. Assuming that "1100"=12 is inputted as the Huffman code input, the value "−7" set in the 4-bit virtual address storage is added to "12", thus "5" is obtained as an address, and decoded data for "1100" as the stored content of the address "5" is outputted from the memory circuit 511. The virtual address values for other code lengths can be calculated in a similar manner. Further, as long as the number of bits necessary to represent a value as a result of addition between a value stored as a virtual address and the input Huffman code 100 is smaller than the number of bits of an address to the memory circuit 511, the number of bits of register of each virtual address storage can be reduced. Note that the number of bits to represent the value stored as a virtual address must be the number of bits to represent the number of codes of the same code length as that of the input Huffman code.

The Huffman code input 500 Ls inputted into the adders 505 to 508. The adders 505 to 508 add the code to the virtual addresses for the respective bit-length code, thus memory addresses 532 to 535 for the respective code lengths are generated with the delay D1 in FIG. 13. On the other hand, the code-length specification signal generator 514 generates the code length signal 513 with the delay D2 in FIG. 13. The memory address selector 509 selects one of the memory addresses 532 to 535 for the respective code lengths based on the code length signal 513, and outputs a memory address 510 with the delay D3 in FIG. 13. As a result, the delay from the input of the Huffman input signal 500 to the output of the memory address 510 is D1+D3. This removes the large amount of delay corresponding to the delay D6 in FIG. 14.

Fourth Embodiment

Figure 6:
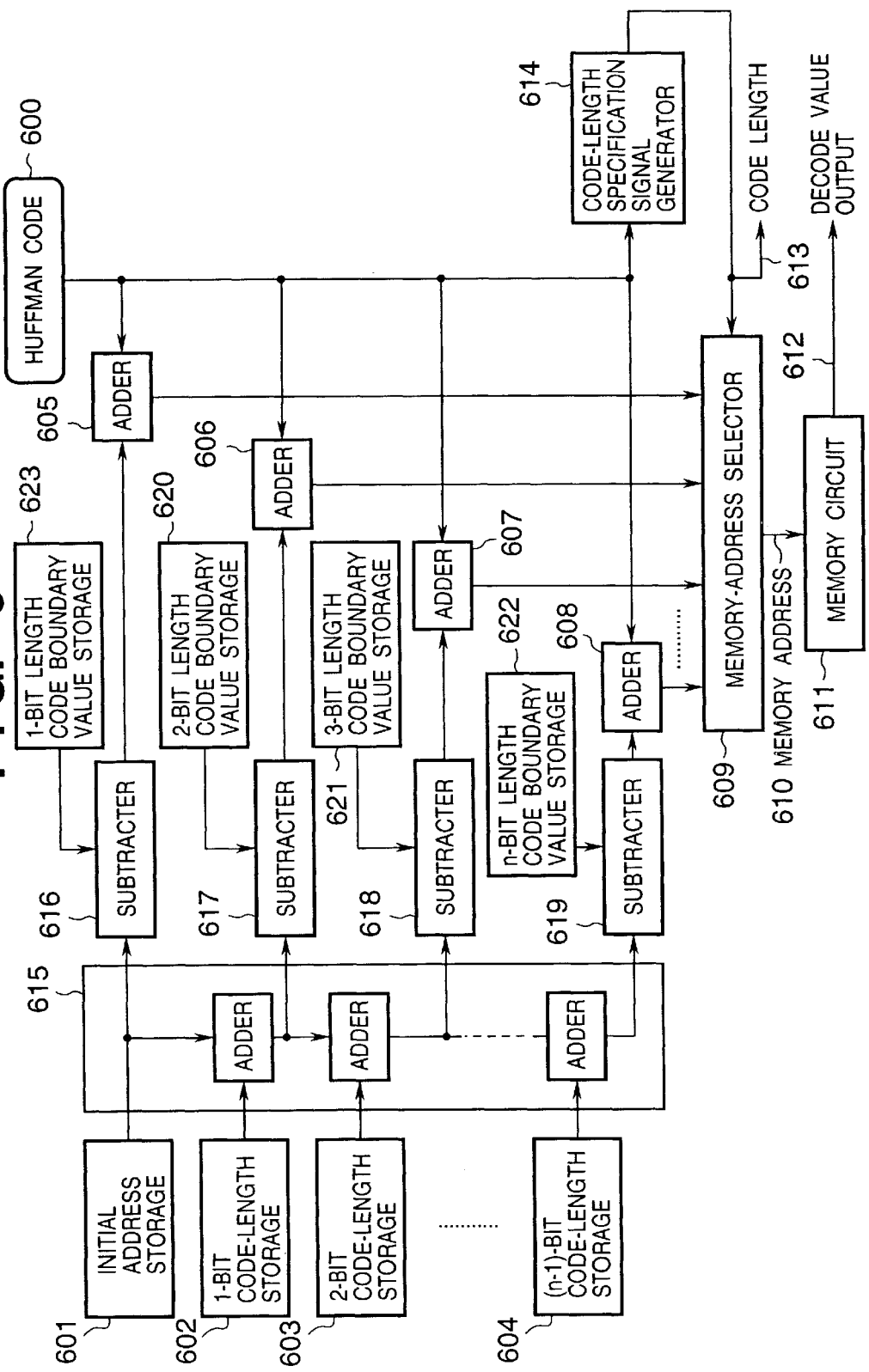
FIG. 6 is a block diagram showing the decoding apparatus according to a fourth embodiment of the present invention.

FIG. 6 is a block diagram showing the fourth embodiment of the present invention. In FIG. 6, numeral 600 denotes a Huffman code input; 601, an initial address storage; 602, a 1-bit code-length code number storage for storing the number of 1-bit code-length codes; 603, a 2-bit code-length code number storage for storing the number of 2-bit code-length codes; and 604, an (n−1)-bit code-length code number storage for storing the number of (n−1)-bit code-length codes. Numeral 615 denotes an accumulator which accumulates base addresses for the respective code lengths to the number of codes of the respective code lengths; and 616 to 619, subtracters which subtract code boundary values as bases of respective code lengths from the base addresses for the respective code lengths obtained by the accumulator 615. Numeral 623 denotes a 1-bit length code boundary value storage; 620, a 2-bit length code boundary value storage; 621, 3-bit length code boundary value storage; 622, an n-bit length code boundary value storage; and 605 to 608, adders. Numeral 614 denotes a code-length specification signal generator; and 613, a code length signal generated by the code-length specification signal generator. Numeral 609 denotes a memory address selector; 610, a memory address selected by the memory address selector 609; 611, a memory circuit; and 612, a decoded value output from the memory circuit 611.

This construction calculates values similar to the virtual addresses for the respective code lengths in the third embodiment. Further, as the held data are not virtual addresses but the numbers of codes for the respective code lengths, a code holding circuit for a short code length can be omitted.

Fifth Embodiment

Figure 7:
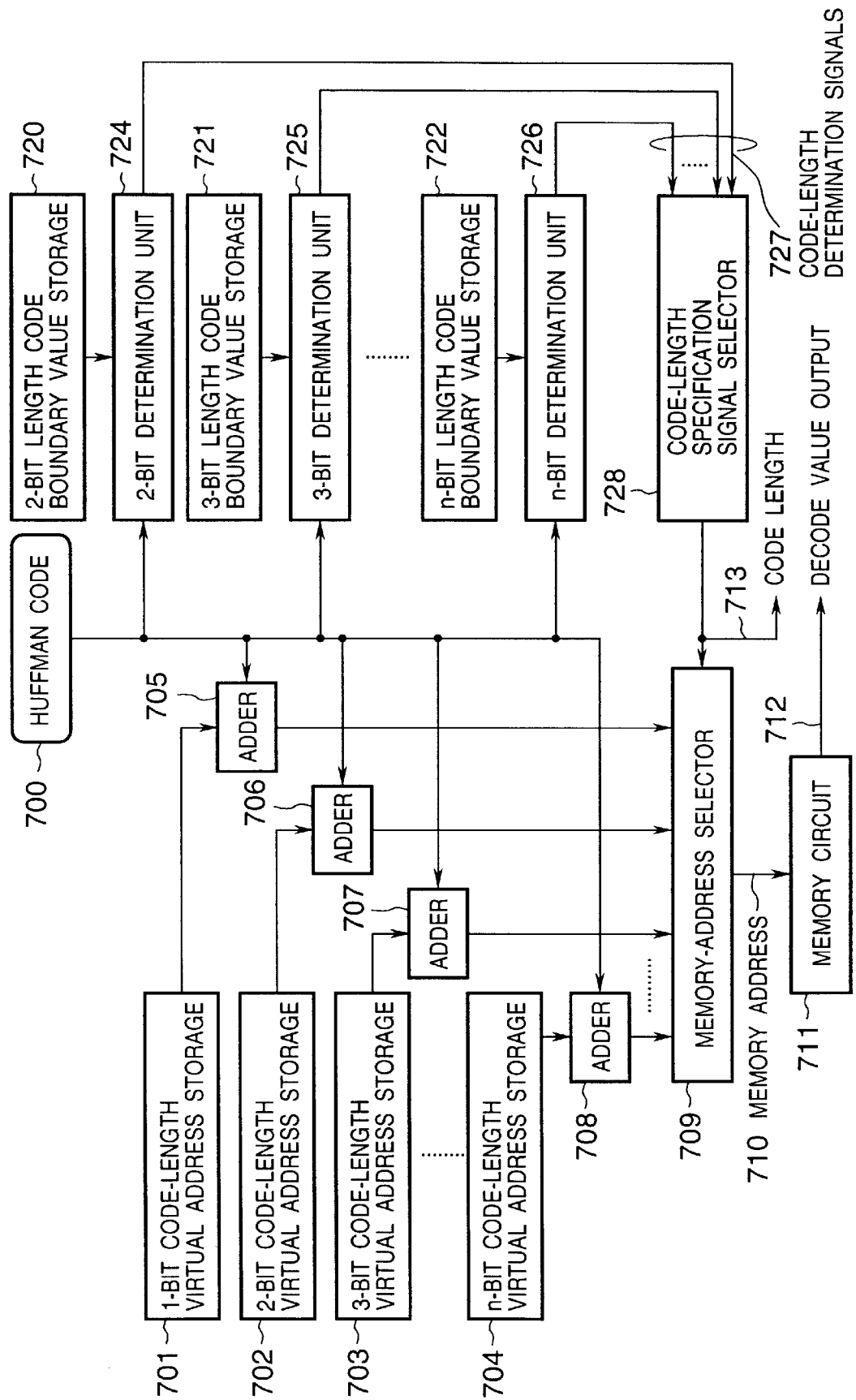
FIG. 7 is a block diagram showing the decoding apparatus according to a fifth embodiment of the present invention.

FIG. 7 is a block diagram showing the decoding apparatus according to a fifth embodiment of the present invention. The construction in this figure can be more easily understood by comparison with that in FIG. 5. Numeral 701 denotes a 1-bit code-length virtual address storage; 702, a 2-bit code-length virtual address storage; 703, a 3-bit code-length virtual address storage; and 704, an n-bit code-length virtual address storage. Numerals 720 to 721 denote respective bit-length code boundary value storages for storing 2-bit length code boundary value, 3-bit length code boundary value . . . , n-bit length code boundary value. Numerals 724 to 726 denote respective bit determination units respectively for determining whether or not the input Huffman code 100 to be decoded has a predetermined number of bits or more. Numeral 709 denotes a memory address selector; 710, a memory address selected by the memory address selector 709; 711, a memory circuit; 728, a code-length specification signal selector; 713, a code length output selected by the code-length specification signal selector 728; and 727, a code-length determination signal outputted from the respective determination units 724 to 726.

The code boundary value storages and the determination units 720 to 728 for the respective code lengths determine the input code length, and one of adders 705 to 708 is selected based on the results of determination from the determination units 724, . . . , 726. Other elements are the same as those in the third embodiment.

Sixth Embodiment

Figure 8:
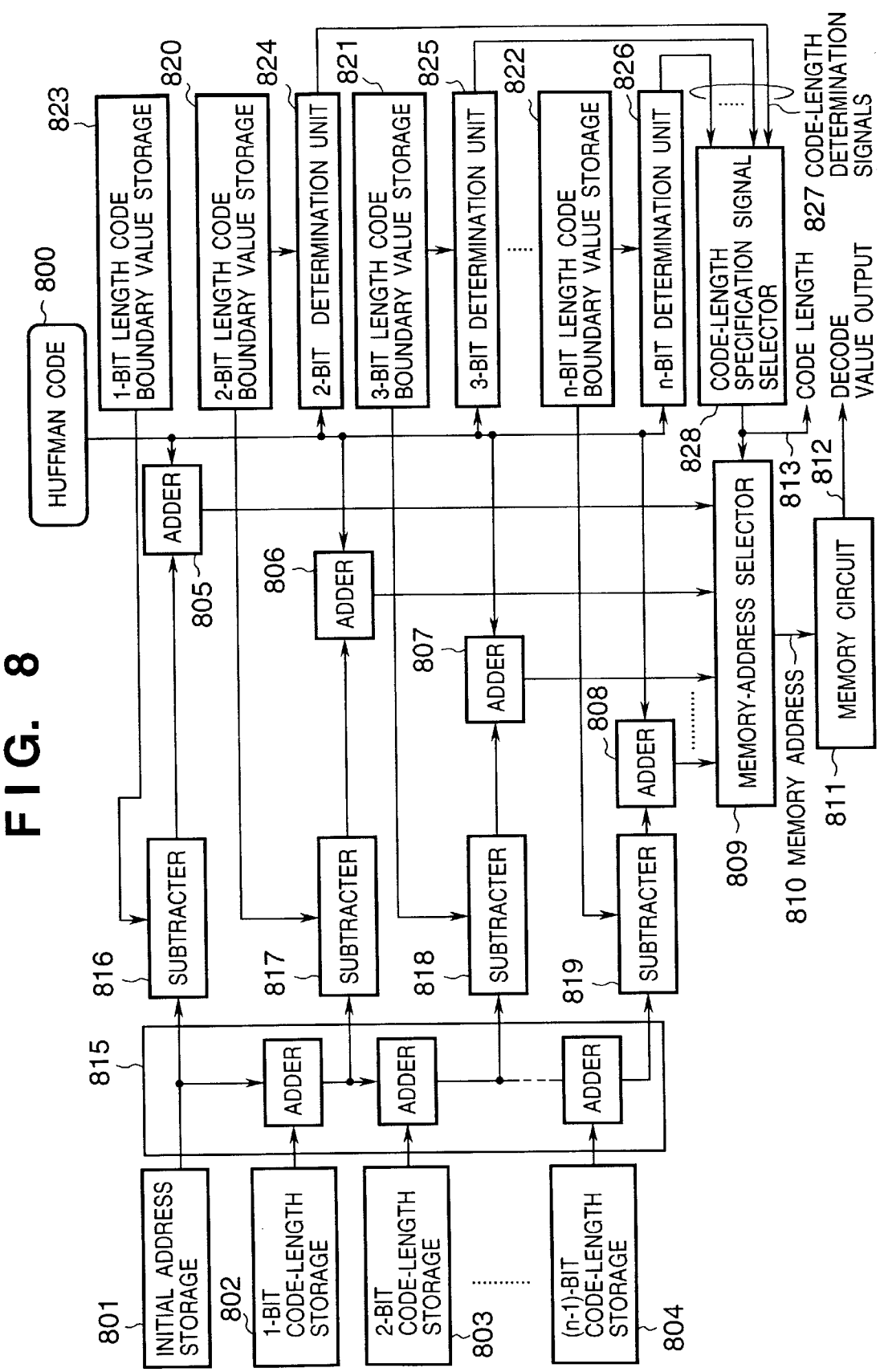
FIG. 8 is a block diagram showing the decoding apparatus according to a sixth embodiment of the present invention.

FIG. 8 is a block diagram showing the decoding apparatus according to a sixth embodiment of the present invention. The construction in this figure can be more easily understood by comparison with the construction of the fourth embodiment in FIG. 6. Numeral 800, a Huffman code input; 801 denotes an initial address storage; 802, a 1-bit code-length code number storage; 803, a 2-bit code-length code number storage; and 804, an (n–1)-bit code-length code number storage. Numerals 805 to 808, adders; and 816 to 819, subtracters. Numerals 823 to 826 denote respective bit length code boundary value storages; 824 to 826, respective bit determination units; and 827, a code-length determination signal outputted from the respective determination units. Numeral 823 denotes a code-length specification signal selector; 813, a code length selected by the code-length specification signal selector 823; 809 a memory address selector; 810, a memory address selected by the memory address selector 809, 811, a memory circuit; and 812, a decoded value output from the memory circuit 811.

The code boundary value storages and determination units 820 to 828 for the respective code lengths determine the input code length, and one of adders 805 to 808 is selected based on the results of determination from the determination units 824, 825 . . . , 826. Other elements are the same as those in the third and fourth embodiments.

As described above, the third to sixth embodiments can attain high-speed processing to obtain information to determine an address value to read a decoded value from a decoded value memory.

Note that in the respective embodiments, the present invention is applied to hardware, however, similar processing may be realized by software. In this case, the memory circuits 112, 511, 611, 711 and 811 are allocated to variable areas provided on an RAM, and the respective calculations may be realized by software. Note that in the construction of the third embodiment, for example, as the processing by the adders 505 to 508 as hardware can be performed in parallel, it is desirable that the processing is performed by hardware if the processing speed is a high priority.

As described above, the third to sixth embodiments enable efficient generation of address and high-speed decoded-data reading from a storage holding decoded data for variable-length codes.

The present invention is not limited to the above embodiments and various changes and modifications can be made within the spirit and scope of the present invention. Therefore, to appraise the public of the scope of the present invention, the following claims are made.

What is claimed is:

1. A decoding apparatus comprising:
   first storage means for continuously storing decoded values for variable-length codes of the same code length;
   second storage means for storing an initial address in said first storage means;
   third storage means for storing offset values between said initial address in said first storage means and addresses for storing decoded values for variable-length codes of respective code lengths, respectively;
   first specification means for specifying a code length of an input variable-length code;
   second specification means for specifying the order of said input variable-length code among variable-length codes belonging to said specified code length; and
   address generation means for generating an address to read a decoded value from said first storage means, based on said offset value corresponding to the code length specified by said first specification means and the order specified by said second specification means.

2. The decoding apparatus according to claim 1, wherein said input variable-length code is a Huffman code.

3. The decoding apparatus according to claim 1, wherein said address generation means generates the address to read the decoded value from said first storage means, by adding said initial address to said offset value corresponding to the code length specified by said first specification means and the order specified by said second specification means.

4. The decoding apparatus according to claim 1, wherein said second specification means specifies said order based on a numerical value of said input variable-length code.

5. The decoding apparatus according to claim 1, wherein said initial address is variable.

6. The decoding apparatus according to claim 1, wherein said initial address is set selectively on the basis of the type of image represented by input variable-length code.

7. The decoding apparatus according to claim 1, wherein said initial address is set selectively on the basis of a device which outputs the input variable-length code.

8. A decoding apparatus comprising:
   first storage means for continuously storing decoded values for variable-length codes of the same code length;
   second storage means for storing plural data each on the number of variable-length codes belonging to each code length;
   first specification means for specifying a code length of an input variable-length code;
   second specification means for specifying the order of said input variable-length code among variable-length codes belonging to said specified code length;
   generation means for generating an accumulated value obtained by accumulating the plural data on the numbers of codes stored in said second storage means based on the code length specified by said first specification means; and
   address generation means for generating an address to read a decoded value from said first storage means based on said accumulated value and the order specified by said second specification means.

9. The decoding apparatus according to claim 8, wherein said input variable-length code is a Huffman code.

10. The decoding apparatus according to claim 8, further comprising third storage means for storing an initial address in said storage means,
    wherein said address generation means generates the address to read the decoded value from said first storage means, based on said initial address, said accumulated value and the order specified by said second specification means.

11. The decoding apparatus according to claim 8, wherein said address generation means generates the address to read the decoded value from said first storage means by adding said initial address to said accumulated value and the order specified by said second specification means.

12. The decoding apparatus according to claim 8, wherein said second specification means specifies said order based on a numerical value of said input variable-length code.

13. The decoding apparatus according to claim 8, wherein said data on the numbers of codes are stored into said second storage means by using only the minimum number of bits to represent the number of variable-length codes which may be decoded in said decoding apparatus.

14. The decoding apparatus according to claim 10, wherein said initial address is variable.

15. A decoding method comprising:
    a first storage step of continuously storing decoded values for variable-length codes of the same code length, into a storage;

a second storage stop of storing an initial address in said storage;

a third storage step of storing offset values between said initial address in said storage and addresses for storing decoded values for variable-length codes of respective code lengths, respectively;

a first specification step of specifying a code length of an input variable-length code;

a second specification step of specifying the order of said input variable-length code among variable-length codes belonging to said specified code length; and an address generation step of generating an address to read a decoded value from said storage, based on said offset value corresponding to the code length specified at said first specification step and the order specified at said second specification step.

16. The decoding method according to claim 1, wherein said input variable-length code is a Huffman code.

17. The decoding method according to claim 1, wherein at said address generation step, the address to read the decoded value from said storage is generated by adding said initial address to said offset value corresponding to the code length specified at said first specification step and the order specified at said second specification step.

18. The decoding method according to claim 1, wherein at said second specification step, said order is specified based on a numerical value of said input variable-length code.

19. The decoding method according to claim 1, wherein said initial address is variable.

20. A decoding method comprising:

a first storage step of continuously storing decoded values for variable-length codes of the same code length, into a storage;

a second storage step of storing plural data each on the number of variable-length codes belonging to each code length;

a first specification step of specifying a code length of an input variable-length code;

a second specification step of specifying the order of said input variable-length code among variable-length codes belonging to said specified code length;

a generation step of generating an accumulated value obtained by accumulating the plural data on the numbers of codes stored at said second storage step based on the code length specified at said first specification step; and an address generation step of generating an address to read a decoded value from said storage based on said accumulated value and the order specified at said second specification step.

21. The decoding method according to claim 20, wherein said input variable-length code is a Huffman code.

22. The decoding method according to claim 20, further comprising a third storage step of storing an initial address in said storage, wherein at said address generation step, the address to read the decoded value from said storage is generated based on said initial address, said accumulated value and the order specified at said second specification step.

23. The decoding method according to claim 20, wherein at said address generation step, the address to read the decoded value from said storage is generated by adding said initial address to said accumulated value and the order specified at said second specification step.

24. The decoding method according to claim 20, wherein at said second specification step, said order is specified based on a numerical value of said input variable-length code.

25. The decoding method according to claim 20, wherein said data on the numbers of codes are stored at said second storage step by using only the minimum number of bits to represent the number of variable-length codes which may be decoded in said decoding apparatus.

26. The decoding method according to claim 22, wherein said initial address is variable.

27. A decoding apparatus which inputs a variable-length code and outputs decoded data, comprising:

storage means for storing decoded data in order of code value if the code values belong to the same code length;

code-length specification means for specifying a code length of an input variable-length code;

a plurality of address storage means respectively for storing address information to specify storage positions of decoded-data as references, stored in said storage means, for respective code lengths;

addition means for adding a value of the input variable-length code to the respective address information stored in said address storage means; and address generation means for selecting one of results of addition by said addition means, in accordance with the code length specified by said code-length specification means, and generating a read address signal to said storage means, wherein data read from said storage means by the read address signal generated by said address generation means is outputted as decoded data.

28. The decoding apparatus according to claim 27, wherein said variable-length code is a Huffman code.

29. The decoding apparatus according to claim 27, wherein values, obtained by subtracting boundary code values representing respective code-length codes from decoded-data storage addresses in said storage means corresponding to the boundary code values, are stored in said address storage means.

30. The decoding apparatus according to claim 29, wherein data, having the number of bits equal to or less than the number of address bits of said storage means, is stored in said address storage means.

31. A decoding method for outputting data, read from storage means containing decoded data in order of code value as long as the code values belong to the same code length, by supplying an address based on an input variable-length code to said storage means, comprising:

a storage step of storing decoded data in order of code value if the code values belong to the same code length, into said storage means;

a code-length specification step of specifying a code length of an input variable-length code;

a plurality of address storage steps respectively for storing address information to specify storage positions of decoded-data as references, stored in said storage means, for respective code lengths;

an addition step of adding a value of the input variable-length code to the respective address information stored at said address storage steps; and an address generation step of selecting one of results of addition at said addition step, in accordance with the code length specified at said code-length specification step, and generating a read address signal to said storage means, wherein data read from said storage means by the read address signal generated at said address generation step is outputted as decoded data.

32. A decoding apparatus which inputs a variable-length code and outputs decoded data, comprising;
- first storage means for storing decoded data in order of code value if the code values belong to the same code length, and in order of code length;
- second storage means for storing the number of codes of each code length;
- code-length specification means for specifying a code length of an input variable-length code;
- a plurality of addition means, each corresponding to each code length, each for accumulating the numbers of codes of the code length and code lengths within the code length, based on said second storage means, and outputting the result of addition;
- calculation means for subtracting reference boundary values, provided for the respective code lengths, from the accumulated numbers of codes as the results of accumulation outputted from said plurality of addition means, and adding a value of the input variable-length code to the results of respective subtraction; and
- address generation means for selecting one of the respective results of calculation by said calculation means, and generating a read address signal to said storage means, based on the code length specified by said code-length specification means,
- wherein data read from said storage means by the read address signal generated by said address generation means is outputted as decoded data.

33. The decoding apparatus according to claim 32, wherein said variable-length code is a Huffman code.

34. The decoding apparatus according to claim 32, wherein said addition means performs accumulation on a predetermined initial address.

35. The decoding apparatus according to claim 34, wherein said initial address is variable.

36. A decoding method for outputting data, as decoded data, read from storage means in which decoded data are stored in order of code value is the code values belong to the same code length, and in order of code length, by providing an address based on an input variable-length code to said storage means, comprising:
- a first storage step of storing decoded data in order of code value if the code values belong to the same code length, and in order of code length, into said storage means;
- a second storage step of storing the number of codes of each code length;
- a code-length specification step of specifying a code length of an input variable-length code;
- a plurality of addition steps, each corresponding to each code length, each of accumulating the numbers of codes of the code length and code lengths within the code length, based on the number of codes of each code length stored at said second storage step, and outputting the result of addition;
- a calculation step of subtracting reference boundary values, provided for the respective code lengths, from the accumulated numbers of codes as the results of accumulation outputted at said plurality of addition steps, and adding a value of the input variable-length code to the results of respective subtraction; and
- an address generation step of selecting one of the respective results of calculation at said calculation step, and generating a read address signal to said storage means, based on the code length specified at said code-length specification step,
- wherein data read from said storage means by the read address signal generated at said address generation step is outputted as decoded data.

* * * * *

UNITED STATES PATENT AND TRADEMARK OFFICE
CERTIFICATE OF CORRECTION

PATENT NO.    : 6,313,767 B1  
DATED         : November 6, 2001  
INVENTOR(S)   : Keiji Ishizuka et al.

It is certified that error appears in the above-identified patent and that said Letters Patent is hereby corrected as shown below:

Column 5,
Line 13, "211," should read -- 217, --.

Column 13,
Line 1, "stop" should read -- step --.

Column 16,
Line 5, "is the code values" should read --, as long as the code values --.

Signed and Sealed this

Twentieth Day of August, 2002

Attest:

JAMES E. ROGAN
Attesting Officer                Director of the United States Patent and Trademark Office